(12) United States Patent
Abe

(10) Patent No.: US 10,359,279 B2
(45) Date of Patent: Jul. 23, 2019

(54) REMOTE CONTROLLABLE MEASURING APPARATUS AND MEASURING SYSTEM

(71) Applicant: MITUTOYO CORPORATION, Kanagawa (JP)

(72) Inventor: Shinsaku Abe, Hokkaido (JP)

(73) Assignee: MITUTOYO CORPORATION, Kanagawa (JP)

(*) Notice: Subject to any disclaimer, the term of this patent is extended or adjusted under 35 U.S.C. 154(b) by 387 days.

(21) Appl. No.: 14/603,767

(22) Filed: Jan. 23, 2015

(65) Prior Publication Data
US 2015/0212915 A1 Jul. 30, 2015

(30) Foreign Application Priority Data

Jan. 29, 2014 (JP) .................. 2014-014980

(51) Int. Cl.
*G06F 11/30* (2006.01)
*G01B 21/04* (2006.01)
*G01R 1/02* (2006.01)

(52) U.S. Cl.
CPC ........ *G01B 21/047* (2013.01); *G01B 2210/58* (2013.01); *G01R 1/025* (2013.01)

(58) Field of Classification Search
None
See application file for complete search history.

(56) References Cited

U.S. PATENT DOCUMENTS

| 6,009,381 A | 12/1999 | Ono |
| 2007/0112939 A1* | 5/2007 | Wilson ................ H04L 12/2807 709/219 |
| 2008/0313356 A1* | 12/2008 | Blinn ..................... H04L 51/04 710/7 |
| 2010/0152565 A1* | 6/2010 | Thomas .................. A61B 3/16 600/405 |
| 2017/0086281 A1* | 3/2017 | Avrahamy ............... C02F 1/42 |

FOREIGN PATENT DOCUMENTS

| JP | 07-318565 | 12/1995 |
| JP | 10-339630 | 12/1998 |
| JP | 2002-186066 | 6/2002 |
| JP | 2013-517504 | 5/2013 |
| WO | 2011/090899 | 7/2011 |

OTHER PUBLICATIONS

A. Rehman, Dec. 26, 2011, Tablet Remote: Control One Android Device With Another via Bluetooth, 4 pages.*
Robert Strohmeyer, Control Your PC From Your Android Tablet: App Roundup, May 18, 2011, 4 pages.*

* cited by examiner

*Primary Examiner* — Tung S Lau
(74) *Attorney, Agent, or Firm* — Greenblum & Bernstein, P.L.C.

(57) ABSTRACT

A remote controllable measuring system includes a remote controllable measuring apparatus having a communication terminal having instant messaging; an input/output for exchanging signals with the communication terminal; a measurer (measuring apparatus main body); and a controller (computation apparatus) causing the measurer to operate according to an instruction from the communication terminal. The remote controllable measuring system also includes a mobile terminal capable of transmitting and receiving signals with the communication terminal.

10 Claims, 16 Drawing Sheets

Wired connection: USB, etc.
Wireless connection: Bluetooth, etc.

REMOTE CONTROLLABLE MEASURING APPARATUS AND MEASURING SYSTEM

CROSS-REFERENCE TO RELATED APPLICATIONS

The present application claims priority under 35 U.S.C. § 119 of Japanese Application No. 2014-014980, filed on Jan. 29, 2014, the disclosure of which is expressly incorporated by reverence herein in its entirety.

BACKGROUND OF THE INVENTION

1. Field of the Invention

The present invention relates to a remote controllable measuring apparatus and measuring system. Specifically, the present invention relates to a remote controllable measuring apparatus and measuring system capable of being linked to a mobile terminal such as a smart phone or a tablet PC (personal computer).

2. Description of Related Art

With various kinds of measuring apparatuses, such as a surface texture measuring apparatus (shape measuring apparatus) or a coordinate measuring apparatus, there may be a desire for assistance from a remote location, such as when an on-site worker overseas is unused to a method for measuring a new product, or troubleshooting is required, for example.

In such cases, information provided only via telephone is insufficient. Therefore, moving image transmission/receiving for checking a measurement environment from a remote location is required between an environment capable of connecting to the Internet and an environment in which a connection is made on a Virtual Private Network (VPN) or the like for security reasons and a measuring apparatus control PC is directly controlled by a method such as remote desktop. In addition, dedicated personnel capable of manipulating the moving image transmission/receiving must be present at both locations. However, the system architecture requires a great deal of cost and training.

An example of a technology for remote controlling a measuring apparatus is given in Japanese Patent Laid-open Publication No. H10-339630, for example, for a remote control apparatus capable, using TCP/IP (Transmission Control Protocol/Internet Protocol) transmissions, of communicating with a host computer connected to a control apparatus controlling a measuring apparatus located in a measuring chamber.

In addition, Japanese Patent Laid-open Publication No. 2002-186066 describes a measuring apparatus system able to e-mail a control terminal and a measuring apparatus, the measuring apparatus system transferring data through the e-mail between instruments including the control terminal and the measuring apparatus, which are connected to a network.

Further, Japanese Publication of PCT International Application No. 2013-517504 mentions connecting a measuring apparatus and a smart phone to transfer data.

Meanwhile, Japanese Patent Laid-open Publication No. H07-318565 describes an audio input/output-ready analysis apparatus that is able to receive voice instructions from an exterior and to send output to the exterior via voice.

However, in the technology described in Japanese Patent Laid-open Publication No. H10-339630, an installation range is limited by cables in the case of a wired LAN (Local Area Network). In the case of a wireless LAN, installation can be performed at a greater distance than with the wired LAN, but an ideal environment is required for stable communication, i.e., an environment where there are no obstacles or obstructions, or an environment where the effect of noise is limited. Furthermore, in a case where a connection is made to the Internet from outside a company, separation from the company's internal LAN must be maintained for security reasons, requiring a significant investment to construct a safe system.

In the technology described in Japanese Patent Laid-open Publication No. 2002-186066, e-mail is routed through a server of a communications company or an e-mail service provider, so there is a large time lag, which is unsuitable for applications requiring near real-time communication. In addition, in a case requiring synchronous control, there is an increase in an exchange of messages with the e-mail server in order to achieve synchronization, and processing time may increase.

Further, Japanese Publication of PCT International Application No. 2013-517504 describes only data transfer and does not address remote control.

Moreover, the technology described in Japanese Patent Laid-open Publication No. H07-318565 requires an operator be near the apparatus.

SUMMARY OF THE INVENTION

The present invention has been conceived in order to resolve the conventional circumstances described above, and therefore provides a measuring apparatus which can be remote controlled in close to real-time, and a remote controllable measuring system using the same.

The present invention resolves the above circumstances with a remote controllable measuring apparatus which includes a communication terminal having instant messaging; an input/output for exchanging signals with the communication terminal; a measurer; and a controller causing the measurer to operate according to an instruction from the communication terminal.

Herein, instant messaging (hereafter referred to as IMing) refers to an application for achieving real-time communication through a computer network (primarily the Internet), exemplified by Skype (registered trademark) and LINE (registered trademark), and is capable of verifying a connecting user and of exchanging short messages between users in real-time. In recent years, file communication, voice communication, and even video chat and the like have come to be installed. Typically, a company with distributed clients provides a central server; however, a large number of compatible clients (clones) have been made by users. There are also examples targeting use on a small-scale LAN and which do not require a central server. When the same IMing is used, one-to-one or one-to-many data transmission and receiving is possible.

Herein, the communication terminal can be attachable/detachable.

In addition, the communication terminal can be a mobile terminal.

The present invention further provides a remote controllable measuring system which includes the above-noted remote controllable measuring apparatus; and a mobile terminal capable of transmitting and receiving signals with the communication terminal.

Herein, the measuring apparatus and the mobile terminal can communicate via the cloud.

In addition, a plurality of measuring apparatuses can be remote controlled by a single mobile terminal.

Furthermore, measurement results from the measuring apparatus can be transmitted to and saved on the mobile terminal.

Measurement results from the plurality of measuring apparatuses can also be transmitted to and saved on the single mobile terminal, enabling centralized management of the plurality of measuring apparatuses by the single mobile terminal.

In addition, a smart phone is designated as the mobile terminal and the communication terminal or input/output of the measuring apparatus can be provided with voice recognition and voice synthesis, enabling the measuring apparatus to communicate with the mobile terminal via voice.

The communication terminal can also include a camera, enabling a measurement environment of the measuring apparatus to be monitored by the camera.

The communication terminal can also include a GPS, enabling a position of the measuring apparatus to be verified by the GPS.

According to the present invention, a measuring apparatus can be remotely controlled from a distant location using a communication terminal provided to the measuring apparatus.

In particular, in a case where the communication terminal is a mobile terminal, 700 to 900 MHz frequency bands (the so-called "platinum bands") can be used, enabling more stable communication as compared to 2.4 to 5.2 GHz WiFi, which is susceptible to noise and greatly influenced by obstructions.

In a case where a mobile terminal capable of transmitting and receiving signals with the communication terminal is provided, similar operation can be achieved via the mobile terminal, even with different measuring apparatuses.

In addition, in a case where a plurality of measuring apparatuses can be remote controlled by a single mobile terminal, an instruction can be transmitted to the plurality of measuring apparatuses simultaneously to perform remote control.

Furthermore, in a case where measurement results from the measuring apparatus are transmitted to and saved on the mobile terminal, the measurement results can be managed by the mobile terminal.

In addition, in a case where measurement results from the plurality of measuring apparatuses are transmitted to and saved on a single mobile terminal, the plurality of measuring apparatuses can be centrally managed by a single mobile terminal.

Also, in a case where the mobile terminal is a smart phone and the communication terminal or input/output of the measuring apparatus is provided with voice recognition and voice synthesis, the measuring apparatus can be controlled via voice.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

Figure 1:
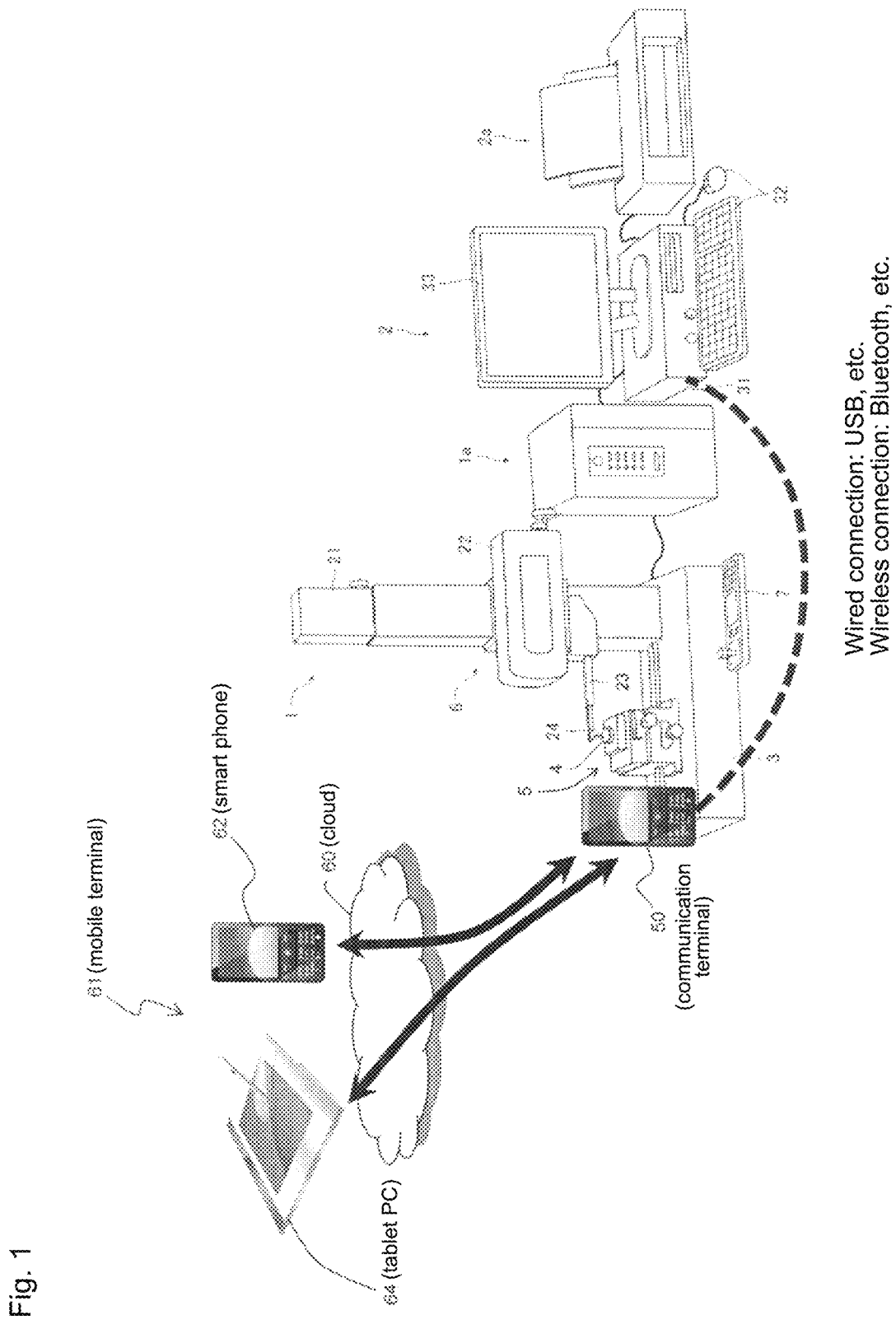
FIG. 1 is a perspective view illustrating an overall configuration of a first embodiment of the present invention applied to a surface texture measuring apparatus (shape measuring apparatus)

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Hereafter, with reference to the drawings, a detailed description is given of embodiments of the present invention in which the present invention is applied to a surface texture measuring apparatus (shape measuring apparatus) such as that proposed by the applicant in Japanese Patent No. 5,205,643. Moreover, the present invention is not limited by the content described in the embodiments and examples that follow. Configuration requirements in the following embodiments and examples may also include that which is readily conceivable by one skilled in the art, that which is substantially similar, and that which encompasses an equivalent scope. Furthermore, the configuration requirements disclosed in the following embodiments and examples may be combined as appropriate, or may be selectively employed as appropriate.

A surface texture measuring apparatus according to an embodiment of the present invention is configured by a measuring apparatus main body 1 and a computation apparatus 2 connected to the measuring apparatus main body 1 via a drive control apparatus 1a. The measuring apparatus main body 1 includes a base 3, a table 5, a displacement detecting apparatus 6, and a console 7 for controlling the above components. The table 5 is provided on top of the base 3 and a reference work piece 4 (measured object having a known reference shape) is placed on the table 5. The displacement detecting apparatus 6 detects displacement of a surface of the reference work piece 4 placed on the table 5. The table 5 is configured to be capable of displacement over the base 3 in an operation direction of a stylus 23 (X axis direction) and a direction orthogonal to the operation direction of the stylus 23 (Y axis direction). In addition, the table 5 is configured to have an incline adjustment structure capable of adjusting a placement surface of the reference work piece 4 to a desired orientation.

The displacement detecting apparatus 6 is configured as follows. Specifically, a column 21 extending upward is provided upright on the base 3, and a slider 22 is mounted to the column 21 so as to be capable of vertical movement. A stylus 23 is mounted on the slider 22. The stylus 23 is configured to be drivable in horizontal (X axis, Y axis) directions and a vertical (Z axis) direction, and includes a contact head 24 on a forefront end thereof. Specifically, the stylus 23 is configured to be capable of relative displacement with respect to the table 5. The contact head 24 is configured to enable a forefront end thereof to contact the measured object.

The contact head 24 extends downward from a bottom surface of the forefront end of the stylus 23 and is configured to be capable of rotation relative to the table 5 about the vertical direction (Z axis direction) as a rotation axis. Including rotational driving of the contact head 24, a contact head driver is configured by the column 21, the slider 22, and the stylus 23.

By displacing the slider 22 and the stylus 23 and scanning (tracing) the contact head 24 over the surface of the reference work piece 4, a surface height Z in each X axis direction position is obtained as measurement data (simulated measurement point Pi). In addition, by displacing the reference work piece 4 in the Y axis direction using the table 5, it is possible to switch between scan lines (measurement paths) extending in the X axis direction.

The computation apparatus 2 imports the simulated measurement point Pi obtained by the displacement detecting apparatus 6. The computation apparatus 2 includes a computation apparatus main body 31 executing computations; a console 32; a display screen 33; and a printer 2a. In addition, the computation apparatus 2 is configured to be capable of controlling operations of the measuring apparatus main body 1 in a manner similar to that of the console 7.

Figure 2:
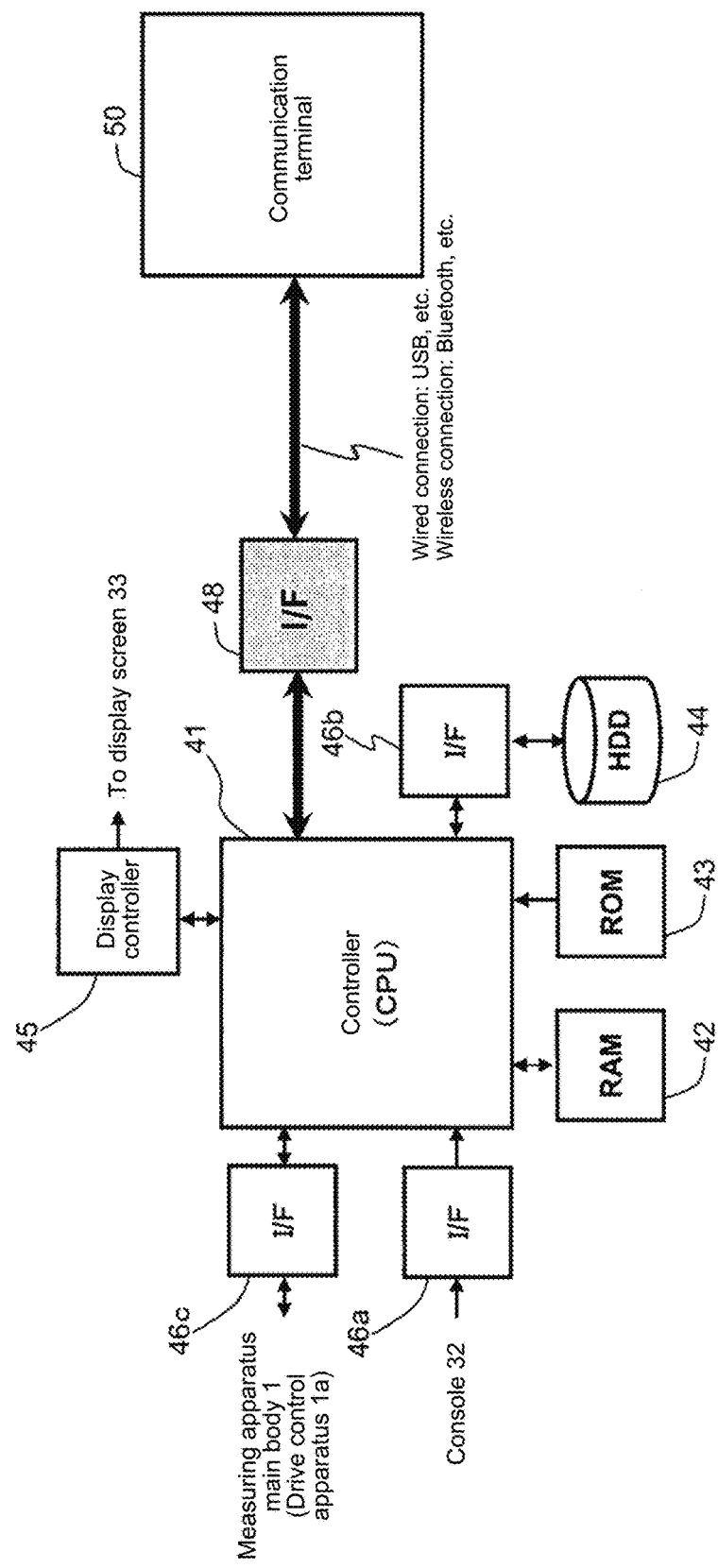
FIG. 2 is a block diagram illustrating a configuration of a computation apparatus main body according to the first embodiment of the present invention.

Next, a configuration of the computation apparatus main body 31 is described with reference to FIG. 2. FIG. 2 is a block diagram illustrating a configuration of the computation apparatus main body 31 according to an embodiment of the present invention.

As shown in FIG. 2, the computation apparatus main body 31 primarily includes a controller (Central Processing Unit (CPU)) 41, a RAM (Random Access Memory) 42, a ROM (Read Only Memory) 43, an HDD (Hard Disk Drive) 44, and a display controller 45. In the computation apparatus main body 31, code data and position data entered using the console 32 is input to the controller 41 via an interface 46a. The controller 41 executes various processes in accordance with various programs stored in the RAM 42 by a macro program (saved in the ROM 43) and the HDD 44 via an interface (I/F) 46b.

The controller 41 controls the measuring apparatus main body 1 via an interface 46c in accordance with a measurement execution process. The HDD 44 is a recording medium in which various control programs are stored. In addition to storing the various programs, the RAM 42 provides a work area for various processes. In addition, the controller 41 displays measurement results, for example, on the display screen 33 via the display controller 45.

The controller 41 reads the various programs from the HDD 44 and runs the program, thereby executing a measurement operation as described in Japanese Patent No. 5,205,643. The controller 41 controls the column 21, the slider 22, and the stylus 23, and displaces the contact head 24 along the mutually orthogonal horizontal directions (X axis and Y axis) and along the vertical direction (Z axis). During measurement, the controller 41 drives the contact head 24 so as to trace the surface of the measured object and also obtains the position of the forefront end of the contact head 24 as the simulated measurement point Pi. The controller 41 calculates the surface shape of the measured object based on the simulated measurement point Pi obtained, and on a three-dimensional contact head model M2 defining a shape of the forefront end of the contact head 24. Using the contact head 24, the controller 41 takes a tracing measurement of the reference work piece 4 having the reference shape, then calculates the three-dimensional contact head model M2.

Figure 3:
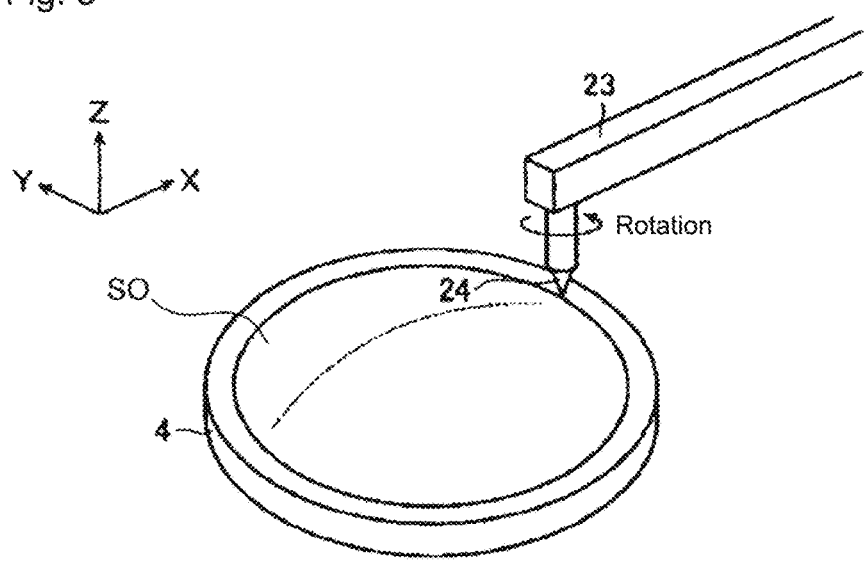
FIG. 3 is a perspective view illustrating a state in which a reference work piece is measured according to the first embodiment of the present invention.
Figure 4:
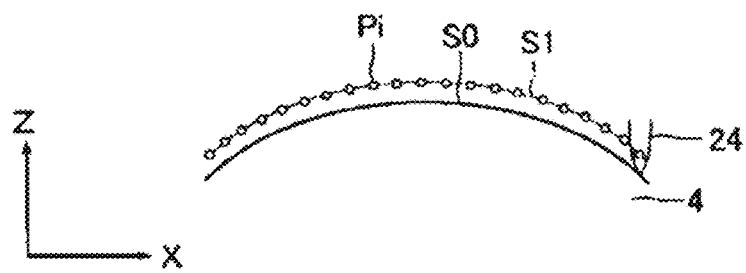
FIG. 4 illustrates a simulated measured surface S1 according to the first embodiment of the present invention.

In addition, the controller 41 controls a drive mechanism (not shown in the drawings) within the stylus 23 and, as shown in FIG. 3, rotationally drives the contact head 24 centered on the Z axis. In each of a plurality of rotation positions where the contact head 24 is rotationally driven, the controller 41 displaces the contact head 24 along the X axis direction and the Z axis direction and, as exemplified in FIG. 4, performs a tracing measurement of the reference work piece 4; obtains the simulated measurement point Pi, which is separated from a work piece surface S0 (surface of the reference work piece 4) by only a predetermined distance; and calculates the three-dimensional contact head model M2 based on the simulated measurement point Pi obtained. In the drawings, S1 is a simulated measured surface configured by linking the simulated measurement points Pi.

Figure 5:
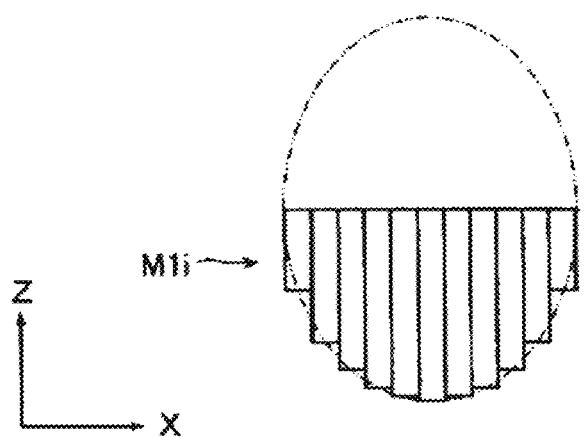
FIG. 5 illustrates a two-dimensional contact head model M1$i$ according to the first embodiment of the present invention.
Figure 6:
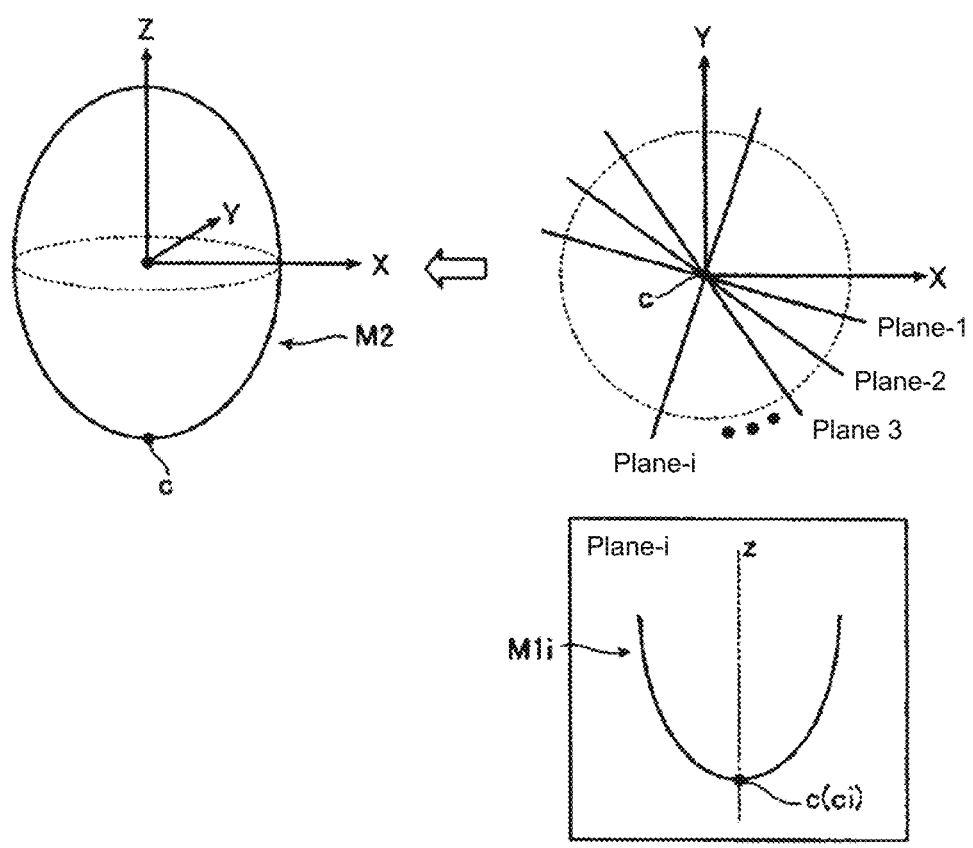
FIG. 6 illustrates a three-dimensional contact head model M2 according to the first embodiment of the present invention.

In addition, in each of the rotation positions of the contact head 24, the controller 41 calculates a two-dimensional contact head model M1i, as exemplified in FIG. 5, based on the obtained simulated measurement points Pi; synthesizes the calculated two-dimensional contact head model M1$i$ in each rotation position of the contact head 24; and calculates the three-dimensional contact head model M2 as exemplified in FIG. 6.

In addition, the controller 41 repeats a process in which a three-dimensional contact head model M0, provided as an initial value, or the calculated three-dimensional contact head model M2 is placed on the simulated measurement points Pi within a virtual space; a contact status between the three-dimensional contact head model and the reference work piece 4 is investigated; and the three-dimensional contact head model is corrected based on the contact status.

The first embodiment according to the present invention is the surface texture measuring apparatus described above in which, as shown in FIG. 1, real-time communication with a mobile terminal 61 such as a smart phone 62 or a tablet PC 64 via a cloud 60 (e.g., the internet of other network) is enabled by further providing an input/output interface 48 and a communication terminal (e.g., smart phone) 50 having a connection to the input/output interface 48 that is either a wired connection via USB, for example, or a wireless connection using Bluetooth (registered trademark) or the like.

There is no clear technical definition of the cloud 60; however, in the present specification, the cloud 60 is a configuration in which two or more terminals (one terminal and a terminal connected to each measuring apparatus) at remote locations from each other (such as cellular telephones, PHS, or satellite telephones) use processes such as measurement control and storage of measurement results over a mobile communication network as a measuring apparatus service via a measuring apparatus application installed on both terminals, and is defined as a mode of use in which, rather than transmitting and receiving information asynchronously via a server as in e-mail (a mode unable to simultaneously send and receive), information is transmitted and received in real-time among one-to-one or one-to-many terminals (one terminal and the terminal connected to each measuring apparatus).

Figure 7:
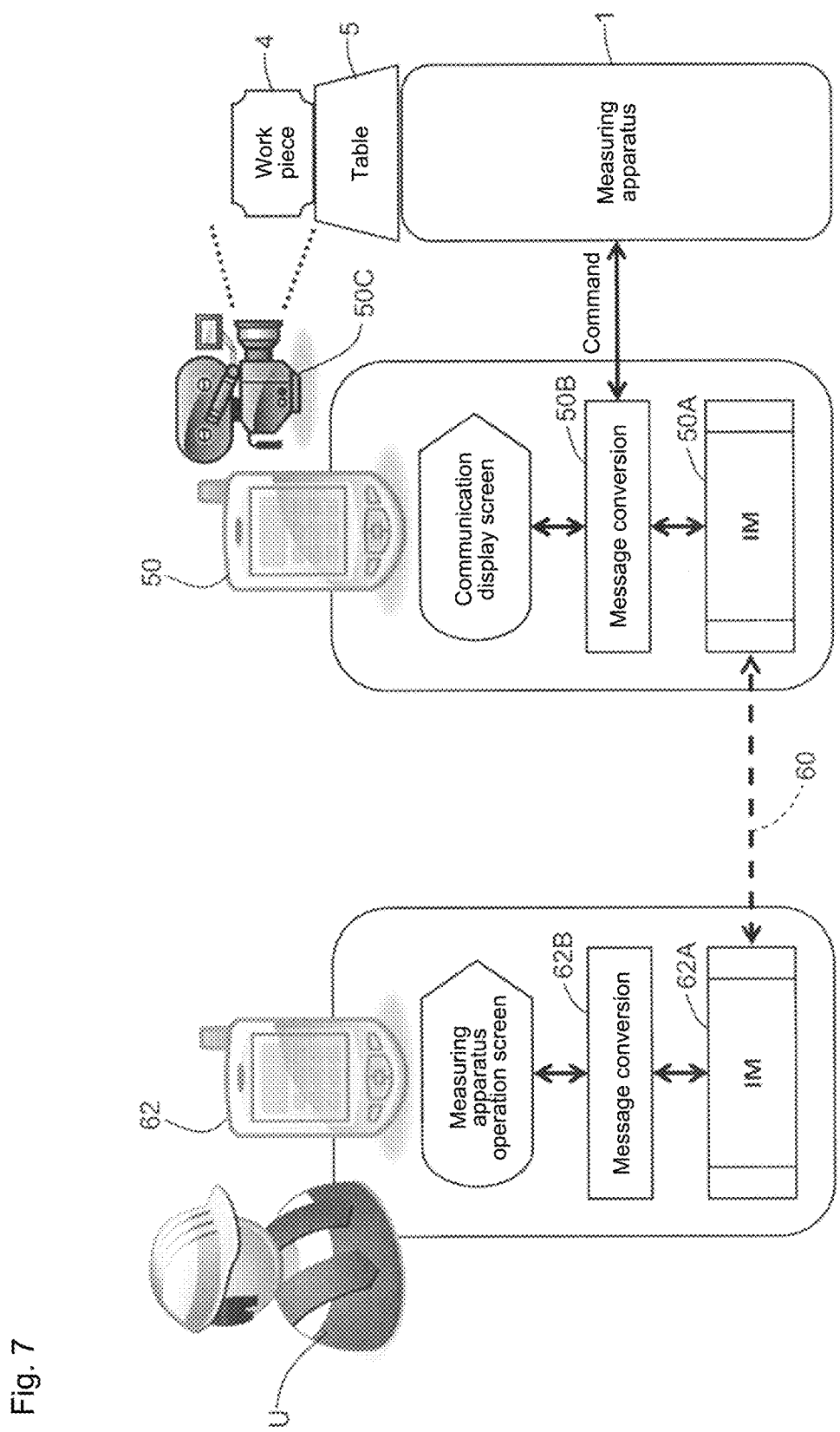
FIG. 7 is a block diagram illustrating a configuration of principal components according to the first embodiment of the present invention.

As shown in FIG. 7, a communication terminal 50 includes IMing 50A; message conversion 50B in which a measurement control message is converted into a measuring apparatus command and transmitted, and in which control information such as operation response results or measurement results from the measuring apparatus is converted into an operation screen display message; and a camera 50C.

Further, also as shown in FIG. 7, a user U-side mobile terminal 61 (e.g., the smart phone 62) includes IMing 62A and message data conversion 62B in which user input is converted into a measurement control message and a message from the measuring apparatus for operation response results or measurement results, for example, is converted into control information for operation screen display.

Figure 8:
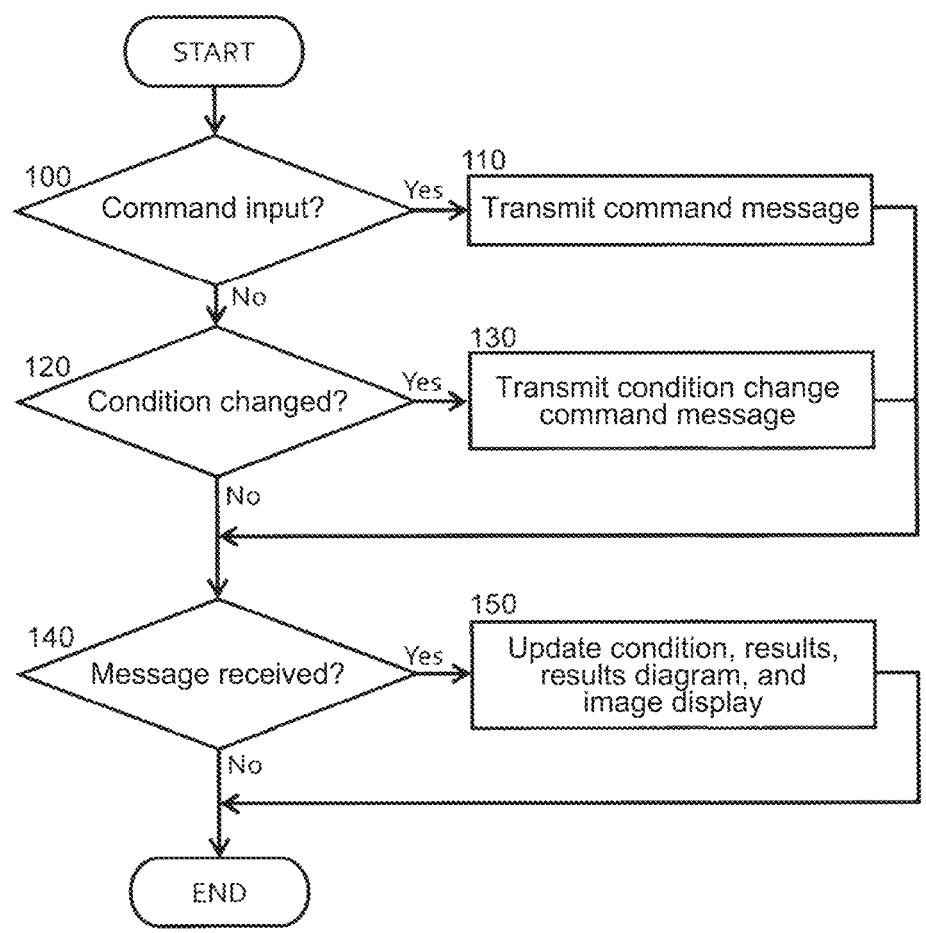
FIG. 8 is a flowchart illustrating a process flow on a mobile terminal side according to the first embodiment of the present invention.

A process flow on the side of the mobile terminal 61 according to the present embodiment is shown in FIG. 8.

First, in step 100, a determination is made as to whether a command input is required. When a determination result is affirmative, the process advances to step 110 and transmits a command message.

Conversely, when the determination result of step 100 is negative, the process advances to step 120 and determines whether there is a change in measurement conditions. When the determination result is affirmative, the process advances to step 130 and transmits a condition change command message.

After one of steps 110 and 130 has ended, or when the determination result of step 120 is negative, the process advances to step 140 and determines whether a message has been received. When the determination result is affirmative, the process advances to step 150 and updates the conditions, results, result diagram, and image display.

After step 150 has ended, or when the determination result of step 140 is negative, the process ends.

Figure 9:
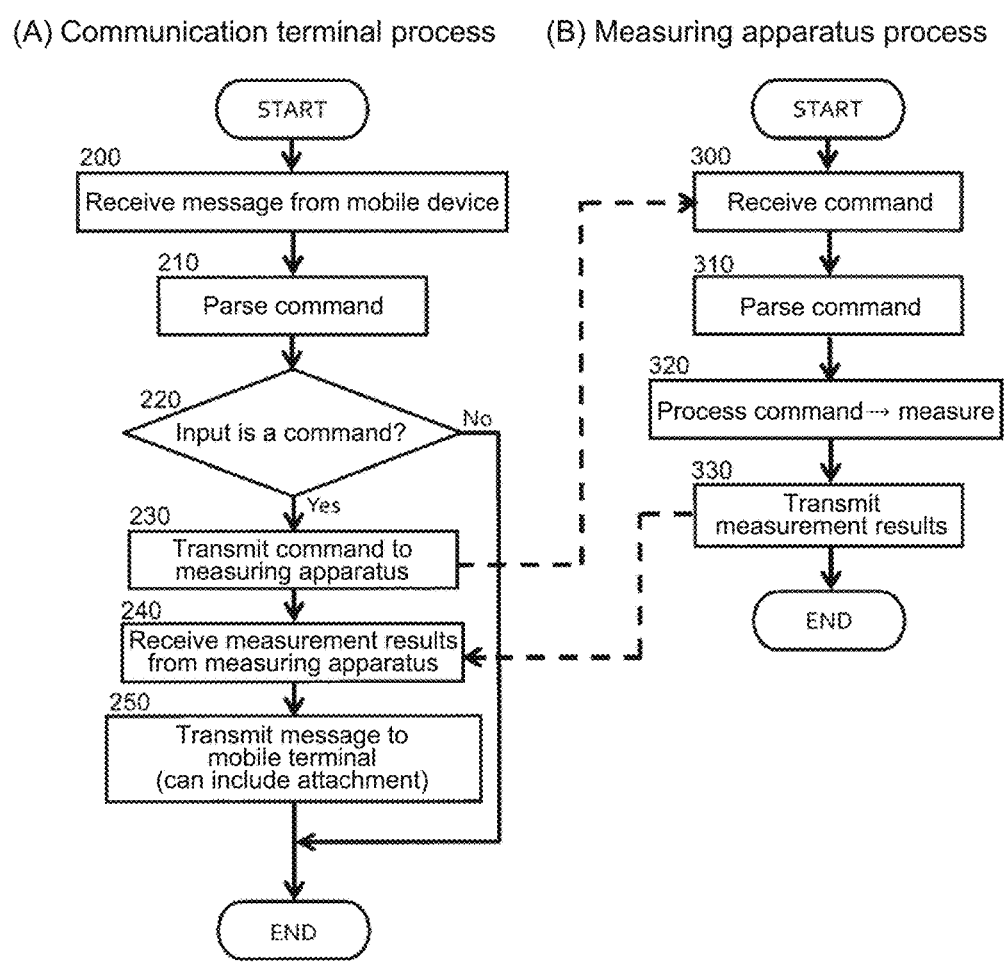
FIG. 9 is a flowchart illustrating a process flow on a communication terminal side (A) and a measuring apparatus side (B) according to the first embodiment of the present invention.

In FIG. 9, processes on the side of the communication terminal 50 are shown in (A), while processes on the side of the measuring apparatus are shown in (B).

In FIG. 9, on the side of the communication terminal 50 (A), first a message from the mobile terminal 61 is received in step 200, the command is parsed in step 210, and a determination is made as to whether it is a command in step 220. When a determination result is affirmative, the process advances to step 230 and transmits the command to the measuring apparatus.

In FIG. 9, on the side of the measuring apparatus (B), the command is received in step 300, the command is parsed in step 310, the command is processed and measurement is performed in step 320, and measurement results are transmitted (response is sent) to the communication terminal 50 in step 330.

In FIG. 9, on the side of the communication terminal 50 (A), the measurement results are received from the measuring apparatus in step 240, and a message is sent to the mobile terminal 61 in step 250. In this case, the measurement results can also be attached to the message.

After step 250 has ended, or when the determination result of step 220 is negative, the process ends.

Figure 10:
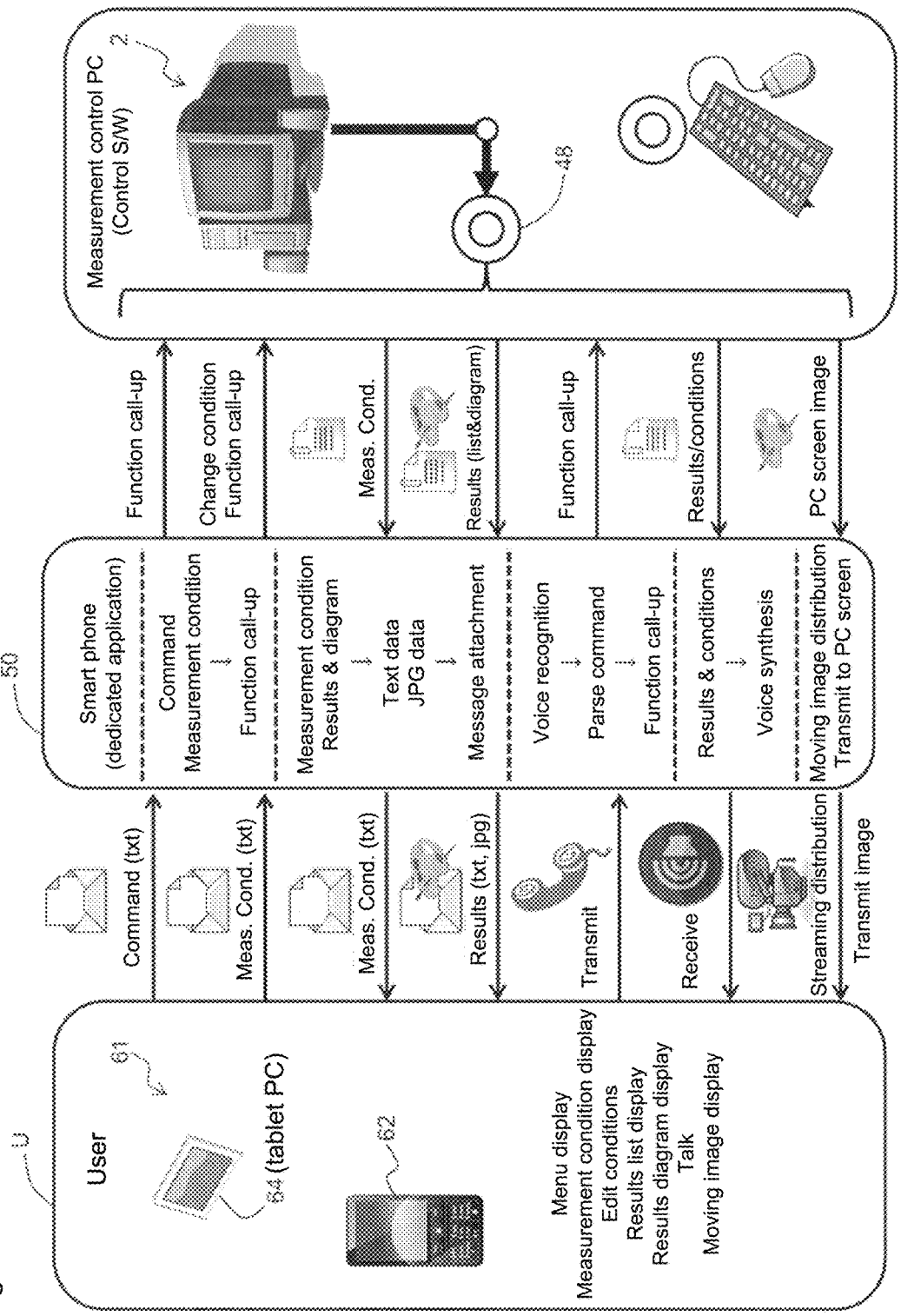
FIG. 10 illustrates overall operations according to the first embodiment of the present invention.

Overall operations in this scenario are collectively illustrated in FIG. 10.

Figure 11:
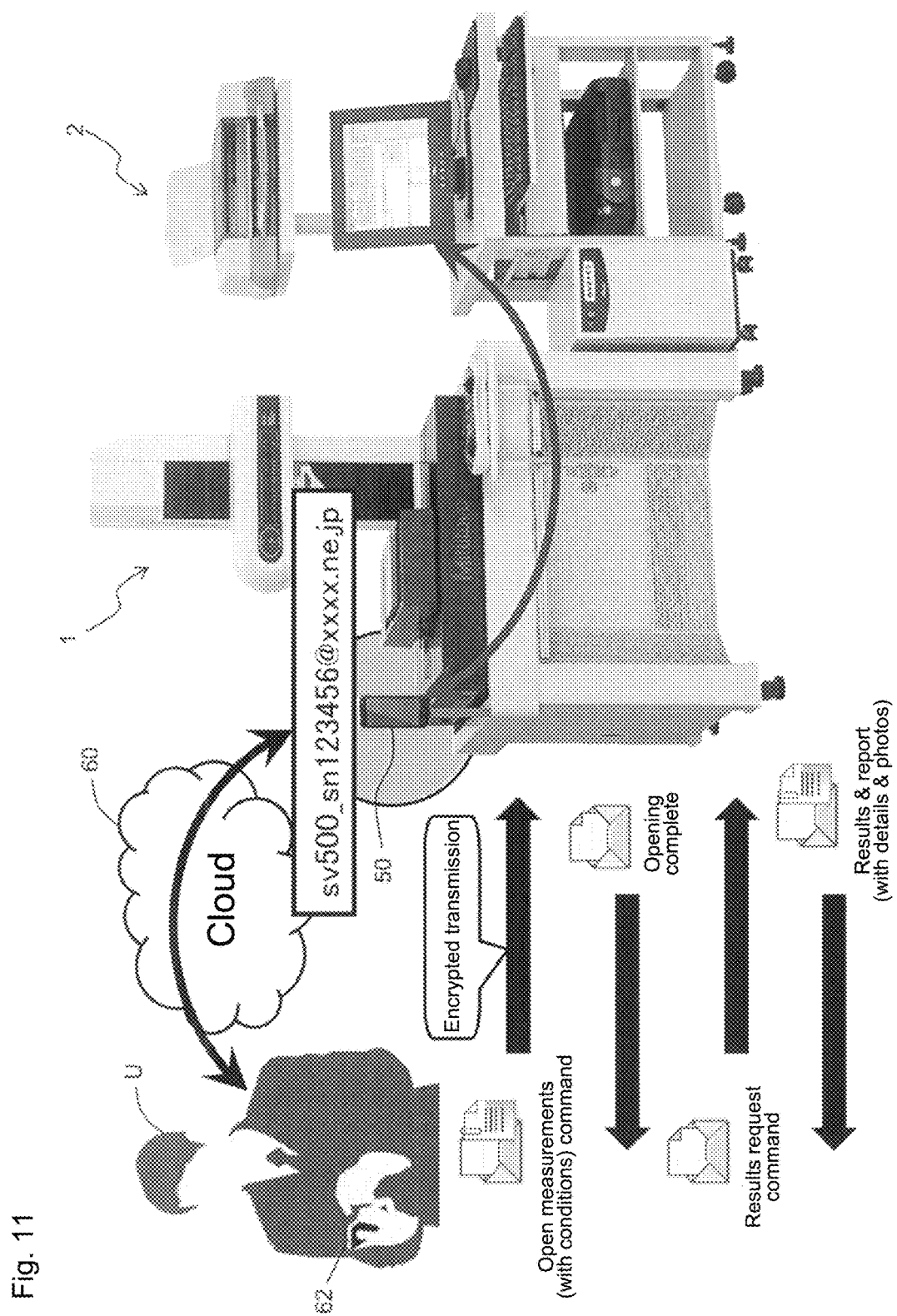
FIG. 11 is a conceptual diagram illustrating a state in which remote control is performed from a distant location according to the first embodiment of the present invention.

FIG. 11 illustrates a state in which remote control is performed from a distant location using the present embodiment. By installing various remote operation commands in this way, different measuring apparatuses can be controlled by standardized commands, results from different measuring apparatuses can be saved in a standardized format (e.g., Portable Document Format (PDF) or Extensible Markup Language (XML)-based XPS), and specifications for measurement analysis conditions (e.g., XML) can also be standardized. Moreover, the embodiment can be used for measurement in restricted access areas such as a nuclear plant or a laboratory.

Figure 12:
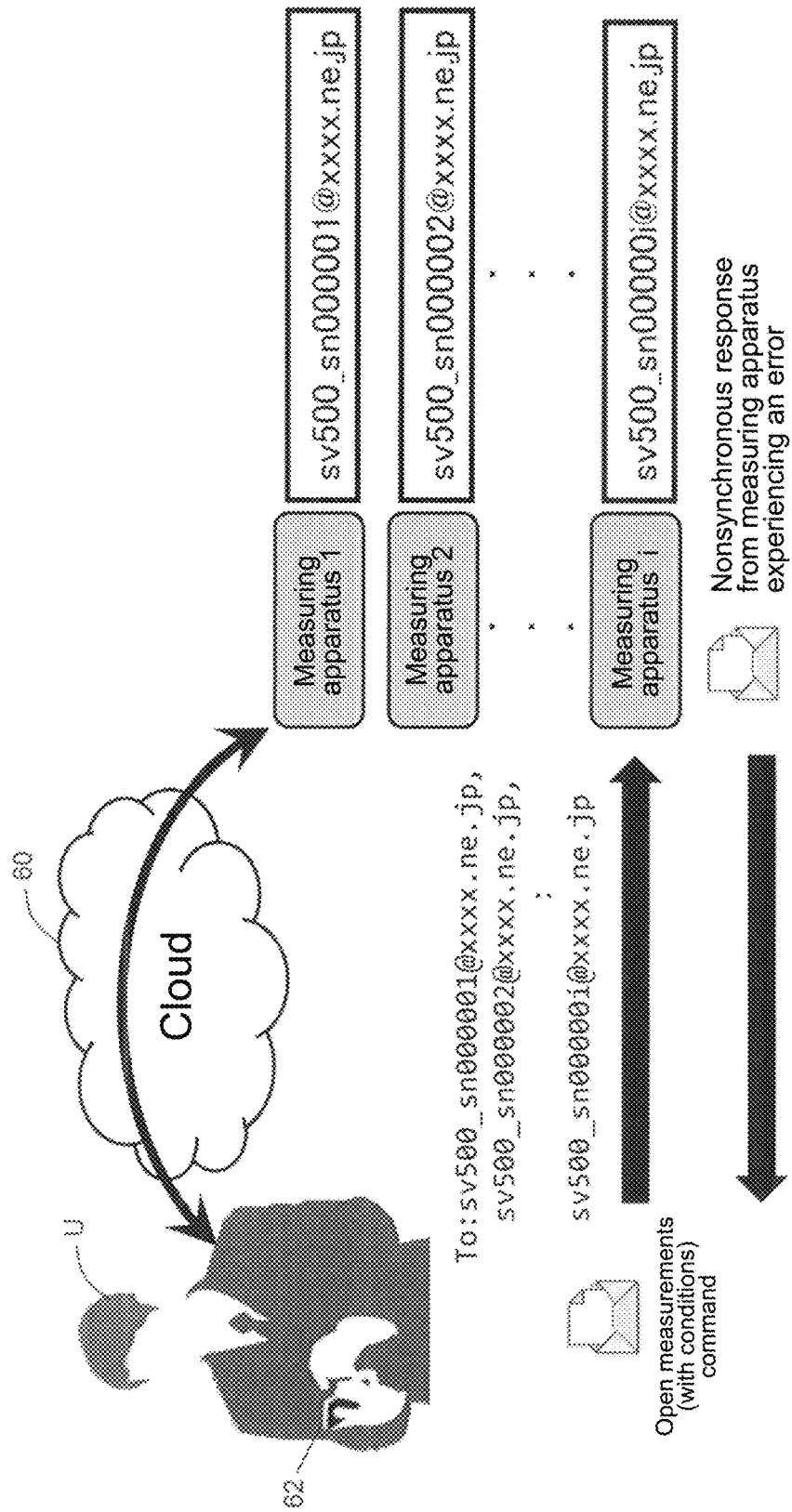
FIG. 12 is a conceptual diagram illustrating a state in which collective control is performed on a plurality of measuring apparatuses according to the first embodiment of the present invention.

A state in which collective control is performed on a plurality of measuring apparatuses is illustrated in FIG. 12. In this way, collective control and centralized management become possible even when there is no dedicated circuit or dedicated software for the measuring apparatuses, and the embodiment can be applied to simultaneous inspection of measurements in a plurality of locations on a large work piece or over a large-scale production line.

Figure 13:
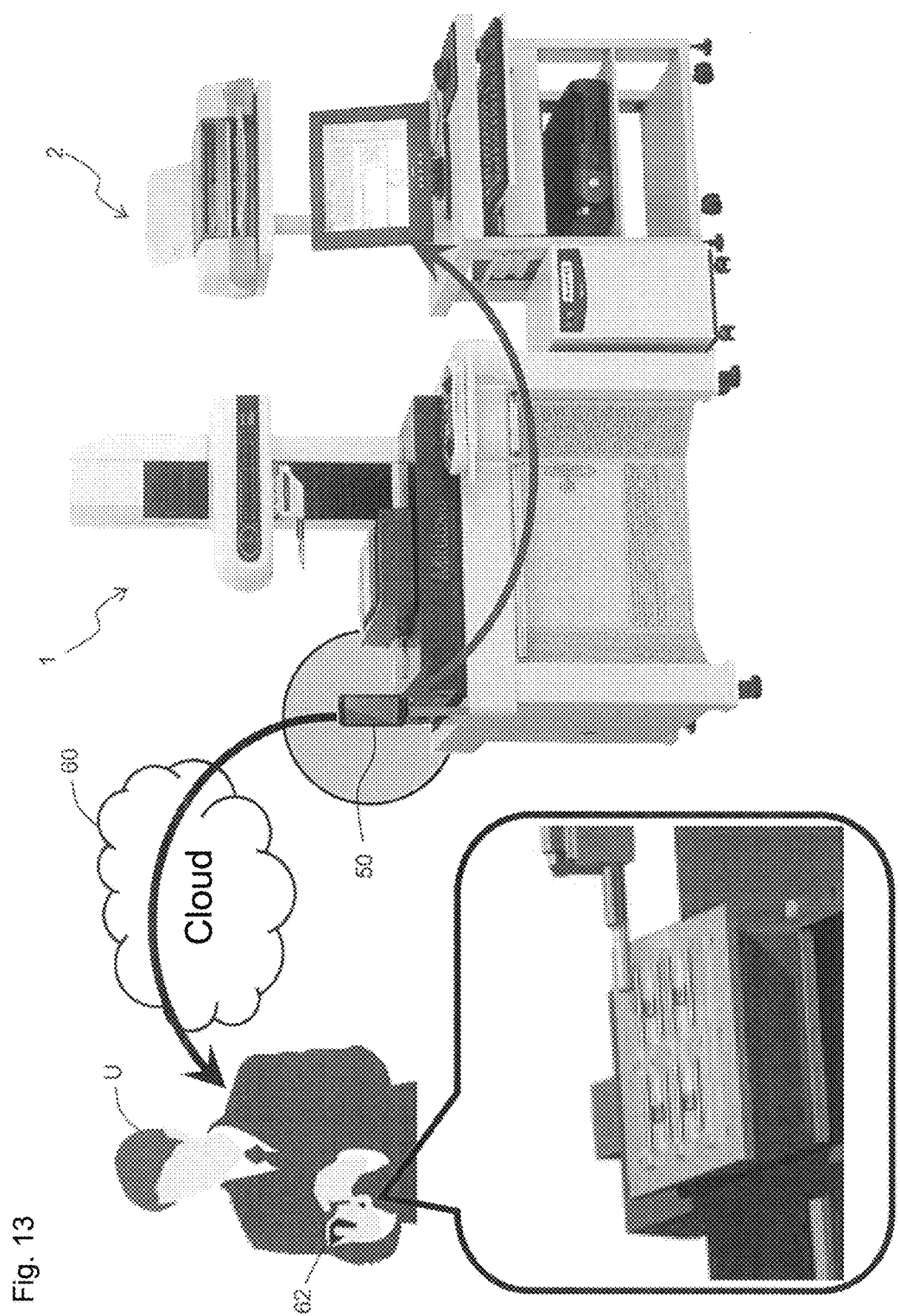
FIG. 13 is a conceptual diagram illustrating a state in which a measurement environment is relayed in moving images according to the first embodiment of the present invention.

A state in which a measurement environment is relayed in moving images is illustrated in FIG. 13. In this way, a measurement environment captured by the camera 50C can be live-distributed using streaming, and a measurement status can be verified while zooming in and out of moving images on a screen of the smart phone 62.

Figure 14:
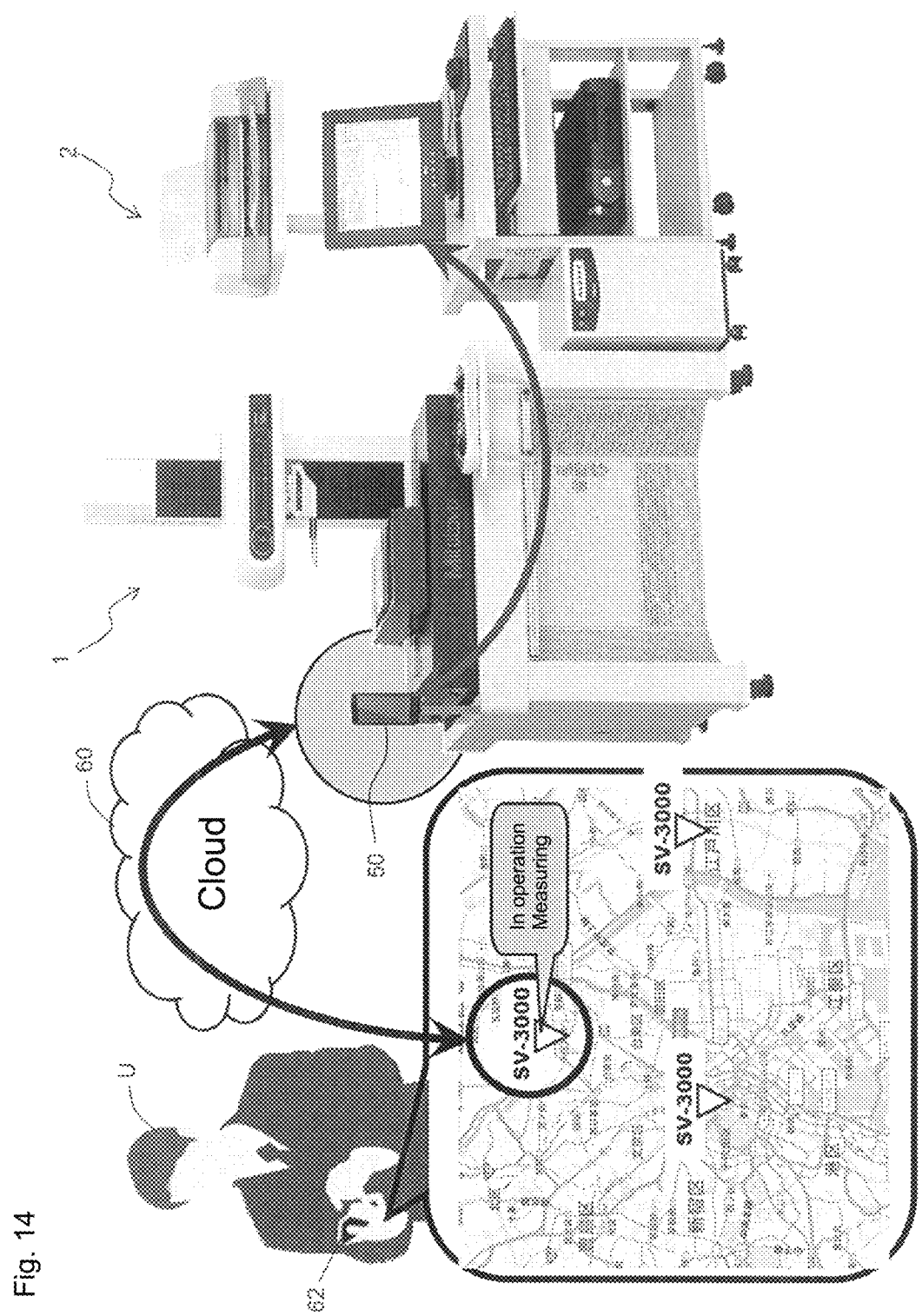
FIG. 14 is a conceptual diagram illustrating a state in which a measuring apparatus is identified using GPS according to the first embodiment of the present invention.

A state in which a measuring apparatus is identified using a global positioning system (UPS) is illustrated in FIG. 14. In this way, the embodiment can also be applied to verifying an installation position/status of a measuring apparatus and mapping measuring apparatus position data onto map data, display of the measuring apparatus status, automatic connection through selection of a measuring apparatus, and detecting measuring apparatus relocation.

Next, a second embodiment of the present invention is described which is capable of remote voice control.

Figure 15:
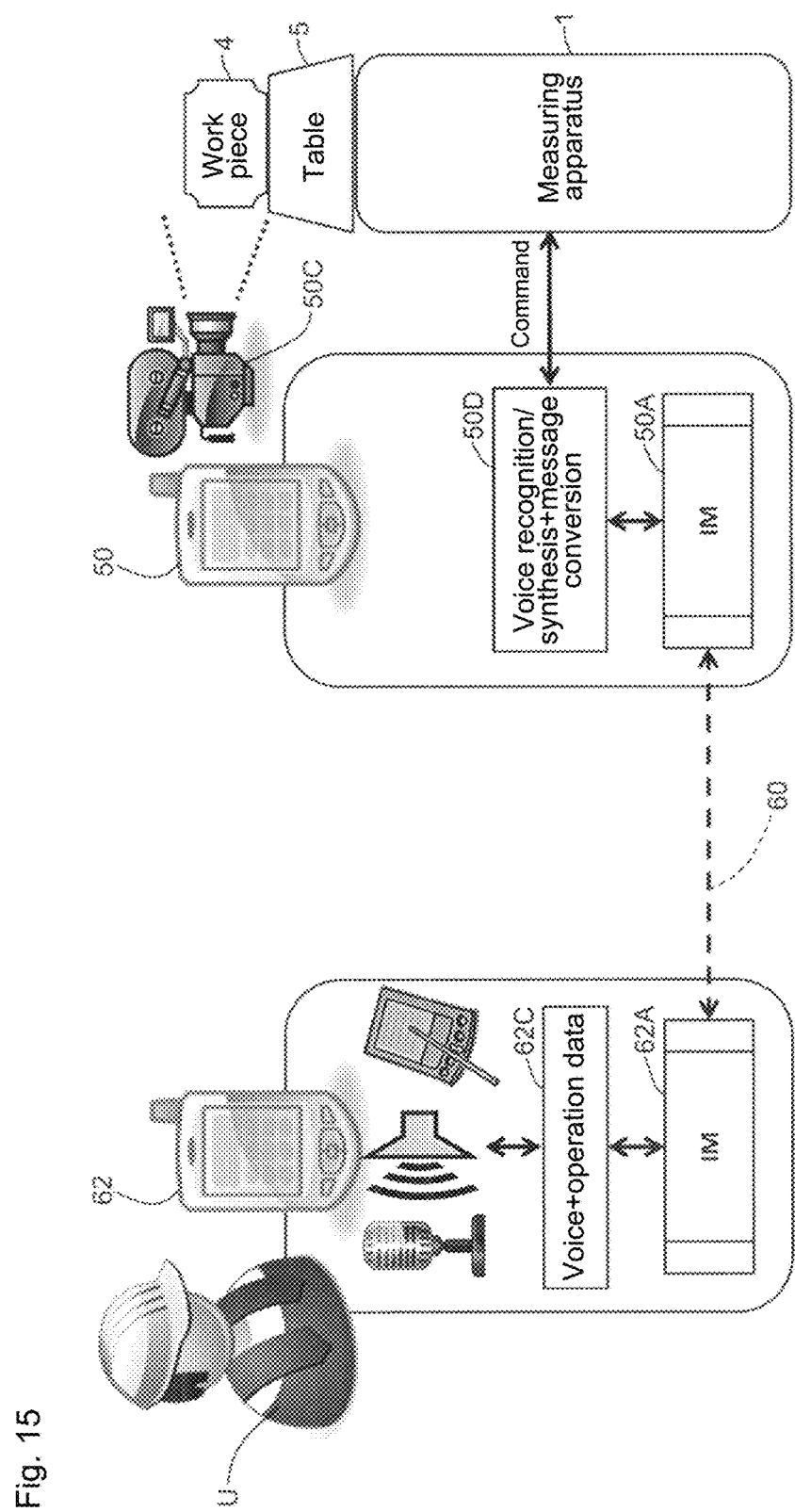
FIG. 15 is a block diagram illustrating a configuration of principal components according to a second embodiment of the present invention.

As shown in FIG. 15, the present embodiment adds, within the communication terminal 50 having the IMing 50A, voice recognition/synthesis+message conversion 50D in which audio is recognized and converted to a control command, and a response from the measuring apparatus is synthesized as a voice; and includes on the smart phone 62 voice+operation data conversion 62C converting audio and an input into a message, and converting audio and data such as operation response results and measurement results from the measuring apparatus into audio output and screen display.

Figure 16:
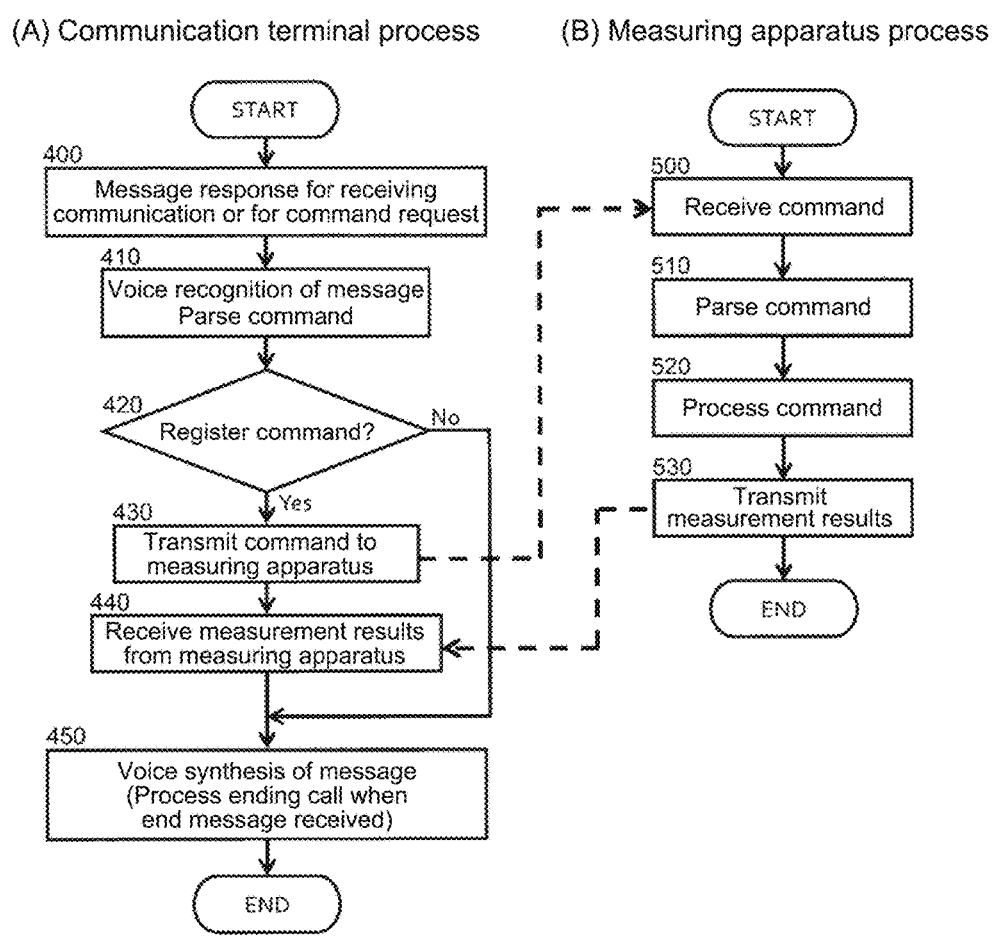
FIG. 16 is a flowchart illustrating a process flow on a communication terminal side (A) and a measuring apparatus side (B) according to the second embodiment of the present invention.

In FIG. 16, a process flow on the side of the communication terminal 50 according to the present embodiment is shown in (A), while a process flow on the side of the measuring apparatus is shown in (B).

First, in step 400 on the (A) side of FIG. 16, a message for receiving a communication or for a command request is sent in response. Next, in step 410, message audio is recognized and parsed as a command.

Next, the process advances to step 420 and a determination is made as to whether the command is a registered command. When a determination result is affirmative, the process advances to step 430 and transmits the command to the measuring apparatus side.

Meanwhile, as shown on the (B) side of FIG. 16, on the measuring apparatus side, the command is received in step 500, the command is parsed in step 510, the command is processed and measurement is performed in step 520, and measurement results are transmitted (response is sent) to the communication terminal 50 in step 530.

When this has been done, as shown on the (A) side of FIG. 16, on the communication terminal 50 side, the process advances to step 440 and the measurement results are received from the measuring apparatus. After step 440 has ended, or when the determination result of step 420 is negative, the process advances to step 450 and a message is synthesized as a voice and communicated to the user. Moreover, when an end message is received, the telephone process ends.

Figure 17:
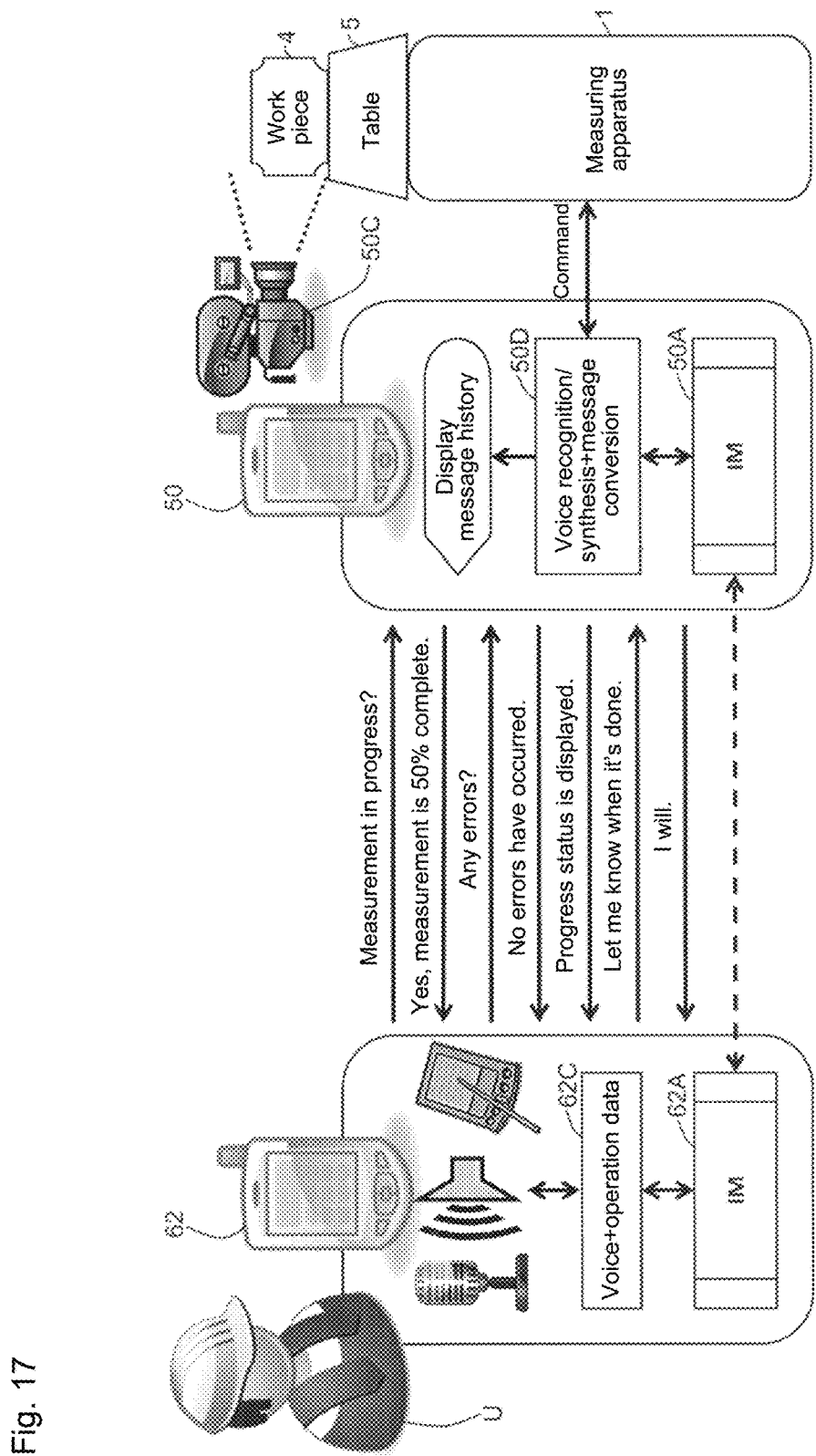
FIG. 17 illustrates overall operations according to the second embodiment of the present invention.

Overall operations of the present embodiment are illustrated in FIG. 17. According to the present embodiment, a broad instruction can be input verbally and a detailed instruction can be input by operating the terminal. In addition, a case where a response to or recognition of the instruction is not possible can be handled with voice synthesis. Further, a detailed response can be displayed on an operation screen, and notification to that effect can be given with voice synthesis. In addition, allocation of an error notification or an end notification, for example, can be handled using telephone communication from the measuring apparatus. Moreover, telephone communication and sending/receiving control data with the user in real-time can be performed simultaneously.

Figure 18:
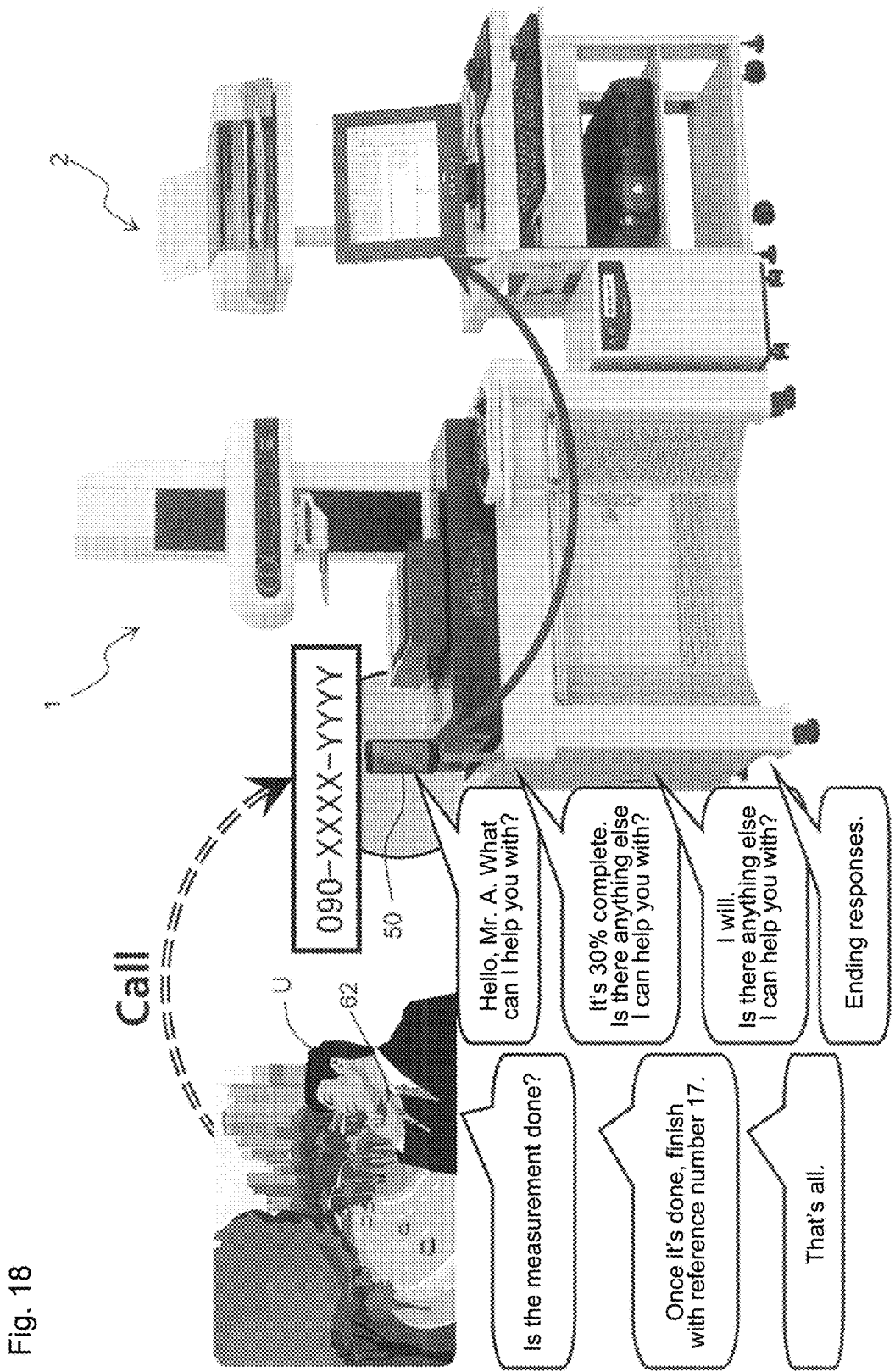
FIG. 18 is a conceptual diagram illustrating a state in which a natural conversation takes place according to the second embodiment of the present invention.

A state in which natural conversation is conducted using the second embodiment is illustrated in FIG. 18. In this way, installing a conversation command using voice recognition/synthesis enables response telephone number registration/communication of an error occurrence time, recognition of a command using voice recognition/response using voice synthesis, and voice recognition command/voice message registration, and enables a natural conversation in response simply by placing a phone call.

First Embodiment
[Measuring Apparatus Assistant Linked to Smart Phone (Hereafter Referred to as a Smart Measuring Apparatus)]

Connecting to an on-site measuring apparatus to directly operate the measuring apparatus while checking a measurement environment via moving images is possible, and an on-site worker can learn measurement operations while being assisted, thus providing the following advantages:

(1) Rapid response is possible no matter where the assistant is located so long as there is access to a smart phone;
(2) Able to connect with P2P (peer-to-peer) real-time communication without requiring an Internet connection;
(3) Can be achieved even when neither party has specialized network knowledge. Accordingly, so long as a telephone connection can be made, non-synchronous (able to communicate while measuring)/real-time control is possible.

Second Embodiment
[Direct Observation using Smart Measuring Apparatus]

Conventional systems transmitting measurement data to a remote location using a telemeter have the following disadvantages during emergency situations:

(1) System transmitting data to a data collection point goes down;
(2) System goes down due to an emergency event or power outage at the data collection point;
(3) Delay in restoring the system due to traffic interruptions en route to the data collection point.

In response, the present invention affords the following effects:

(1) Even when communication infrastructure goes down, the measuring apparatus can be directly observed so long as it is undamaged;
(2) Situation can be ascertained without a person needing to go into a dangerous area;
(3) Detailed data can be obtained using dedicated P2P application;
(4) An advisory (detailed information) or simultaneous notification can be given via audio from the site of an emergency.

Third Embodiment
[Collection of Measurement Data During Earthquake]

The following difficulties in instrument data collection were faced by the Fukushima Daiichi Nuclear Plant in the Tohoku earthquake in Japan:

(1) Unable to collect instrument data due to power outage in central control room;
(2) Restrictions on access due to high radiation level in central control room;
(3) Cellular service down→Hotline was only means of contact;
(4) Only able to conjecture regarding accident in a critical seismic isolation building, with communication conducted exclusively through suicide troops.

Specifically, it was unclear what was occurring in a time-critical situation.

In response, according to the present invention, measurement data can be collected using a smart measuring apparatus capable of non-synchronous communication (where measurements are not interrupted by communication) and real-time data collection on all instruments having battery backup, affording the following effects:

(1) An operator can directly access each instrument and confirm measurement data from anywhere;
(2) Able to obtain detailed measurement data in real-time via P2P communication;

(3) Able to converse with measuring apparatus using voice assistant in the natural language voice recognition/synthesis.

Fourth Embodiment

[Sharing Communication Terminal 50 Among Plurality of Measuring Apparatuses]

In a case where the communication terminal 50 can be attached and detached, the communication terminal 50 can be detached from a measuring apparatus A, attached to a measuring apparatus B, and connected to a control PC of the measuring apparatus B. When the connection is wired, connection/non-connection can be performed simply by attaching and detaching (Bluetooth requires a pairing operation), and the statuses of a plurality of measuring apparatuses A and B can be maintained with a single communication terminal 50. For example, in order to compare the measurement results of the measuring apparatus A with the measurement results of the measuring apparatus B, conventionally the measurement results of each could only be printed out with a printer and visually compared on paper, or the measurement results of one of the measuring apparatuses could only be copied to the control PC of the other of the measuring apparatuses, formatted with document software, and printed out. However, by applying the present invention, the measurement results of both of the measuring apparatuses A and B can be retained in a single communication terminal (simultaneously with completion of a measurement), printing of the measurement results for comparison can be performed from the communication terminal, and convenience for the user can be broadly improved. In addition, while software used to control a measurement is capable of extremely flexible customization, in a case where a plurality of users share a single control PC to perform the measurement, there may be cases where each individual is unable (or it is difficult) to separately customize the software for that individual's ease of use. However, by applying the present invention, each individual becomes able to customize their personal communication terminal 50 for individual use without inconveniencing others, enabling more personalized operation.

Moreover, a surface texture measuring apparatus (shape measuring apparatus) is used as the measuring apparatus in each of the above-described embodiments; however, the measuring apparatus is not limited to only this variety and may also be, for example, a coordinate measuring apparatus.

In addition, the mobile terminal is not limited to a smart phone, and may also be a tablet PC. Further, the voice recognition/synthesis may be provided to the input/output interface 48 rather than to the communication terminal 50.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A remote controllable interactive-type measuring apparatus, the interactive-type measuring apparatus comprising:
   a communication terminal configured to perform real-time remote communication, through a communication network, with a mobile terminal that is separated from the measuring apparatus;
   an input/output configured to exchange signals with the communication terminal;
   a measurer having a stylus with a contact head configured to be displaced in contact and not in contact with a particular surface of a work piece to be measured, the measurer obtaining a measurement of the particular surface when the contact head is in contact with the particular surface of the work piece, and the stylus performs a measurement only when the stylus is in contact with a surface of the work piece, such that the stylus does not perform the measurement when the stylus is not in contact with the surface of the work piece; and
   a controller configured to convert, by the communication terminal, an instruction received from the mobile terminal via the real-time remote communication, to cause the measurer to operate according to the converted instruction received from the communication terminal, to cause the communication terminal to obtain an operation result of the measurer from the input/output, and to cause the communication terminal to transmit, to the mobile terminal via the communication network, the operation result of the measurer,
   wherein the measuring apparatus is stationary, and
   wherein the communication terminal is connected to the measuring apparatus.

2. The remote controllable interactive-type measuring apparatus according to claim 1, wherein the communication terminal is removably attachable to the measuring apparatus.

3. The remote controllable interactive-type measuring apparatus according to claim 2, wherein the communication terminal is another mobile terminal.

4. A remote controllable interactive-type measuring system comprising:
   a measuring apparatus comprising:
      a communication terminal configured to perform real-time remote communication, through a communication network, with a mobile terminal that is separated from the measuring apparatus;
      an input/output configured to exchange signals with the communication terminal;
      a measurer having a stylus with a contact head configured to be displaced in contact and not in contact with a particular surface of a work piece to be measured, the measurer obtaining a measurement of the particular surface when the contact head is in contact with the particular surface of the work piece, and the stylus performs a measurement only when the stylus is in contact with a surface of the work piece, such that the stylus does not perform the measurement when the stylus is not in contact with the surface of the work piece; and
      a controller configured to convert, by the communication terminal, an instruction received from the mobile terminal via the real-time remote communication, to cause the measurer to operate according to the converted instruction received from the communication terminal, to cause the communication terminal to obtain an operation result of the measurer from the input/output, and to cause the communication terminal to transmit, to the mobile terminal via the communication network, the operation result of the measurer, wherein the measuring apparatus is stationary, and wherein the communication terminal is connected to the measuring apparatus; and the mobile terminal configured to transmit and receive signals to and from the communication terminal.

5. The remote controllable interactive-type measuring system according to claim 4, wherein a plurality of measuring apparatuses are each configured to be remotely controlled by a single mobile terminal.

6. The remote controllable interactive-type measuring system according to claim 4, wherein the mobile terminal is further configured to:

receive transmitted measurement results from the measuring apparatus; and save the transmitted measurement results on the mobile terminal.

7. The remote controllable interactive-type measuring system according to claim 4, wherein:

the mobile terminal is a mobile computing device that facilitates both voice and data communication; and at least one of the communication terminal and input/output is provided with voice recognition and voice synthesis capabilities, such that the measuring apparatus performs communication with the mobile terminal via voice.

8. The remote controllable interactive-type measuring system according to claim 4, wherein the communication terminal comprises a camera, such that a measurement environment of the measuring apparatus is monitored by the camera.

9. The remote controllable interactive-type measuring system according to claim 4, wherein the communication terminal comprises a global positioning sensor (GPS), such that a position of the measuring apparatus is verifiable by the GPS.

10. The remote controllable interactive-type measuring system according to claim 5, wherein the single mobile terminal is configured to:

receive transmitted measurement results from the plurality of measuring apparatuses; and save the transmitted measurement results on the single mobile terminal, such that management of the plurality of measuring apparatuses by the single mobile terminal is centralized.

\* \* \* \* \*